(12) United States Patent
Gokan et al.

(10) Patent No.: US 8,093,505 B2
(45) Date of Patent: Jan. 10, 2012

(54) LAYERED ELECTRONIC CIRCUIT DEVICE

(75) Inventors: Manabu Gokan, Hyogo (JP); Akihisa Nakahashi, Osaka (JP); Takayuki Hirose, Osaka (JP); Yoko Kasai, Osaka (JP); Kohichi Tanda, Shiga (JP)

(73) Assignee: Panasonic Corporation, Osaka (JP)

( * ) Notice: Subject to any disclaimer, the term of this patent is extended or adjusted under 35 U.S.C. 154(b) by 412 days.

(21) Appl. No.: 12/438,570

(22) PCT Filed: Aug. 10, 2007

(86) PCT No.: PCT/JP2007/065687
§ 371 (c)(1),
(2), (4) Date: Feb. 24, 2009

(87) PCT Pub. No.: WO2008/050521
PCT Pub. Date: May 2, 2008

(65) Prior Publication Data
US 2010/0230147 A1    Sep. 16, 2010

(30) Foreign Application Priority Data

Oct. 24, 2006  (JP) ................................ 2006-288159

(51) Int. Cl.
*H05K 1/00* (2006.01)
(52) U.S. Cl. ........ 174/258; 174/259; 174/260; 174/261; 174/350; 361/709; 361/749; 361/784; 257/432; 257/622; 257/676; 257/693; 257/702; 257/712; 228/175; 228/180.1; 439/65; 29/825

(58) Field of Classification Search .......... 174/258–261, 174/350; 361/709, 749, 784; 257/432, 622, 257/676, 693, 702, 712; 228/175, 180.1; 439/65; 29/825
See application file for complete search history.

(56) References Cited

U.S. PATENT DOCUMENTS

| | | | | |
|---|---|---|---|---|
| 4,726,382 A | * | 2/1988 | Boehmer et al. ............. 600/480 |
| 4,833,402 A | * | 5/1989 | Boegh-Petersen ....... 324/755.08 |
| 5,295,044 A | * | 3/1994 | Araki et al. .................... 361/709 |
| 5,532,906 A | * | 7/1996 | Hanari et al. ................. 361/749 |
| 5,774,199 A | * | 6/1998 | Ozawa ......................... 349/149 |
| 5,805,251 A | * | 9/1998 | Ozawa ......................... 349/110 |
| 5,990,989 A | * | 11/1999 | Ozawa ............................ 349/61 |
| 6,283,769 B1 | * | 9/2001 | Asao et al. .................... 439/76.2 |
| 6,449,836 B1 | * | 9/2002 | Miyake et al. ................. 29/830 |
| 6,507,384 B1 | * | 1/2003 | Endo et al. .................... 349/149 |
| 6,896,526 B2 | * | 5/2005 | Pitzele ............................. 439/83 |
| 2001/0012706 A1 | * | 8/2001 | Imaeda ........................... 439/66 |
| 2002/0006503 A1 | | 1/2002 | Watanabe et al. ............. 428/209 |

(Continued)

FOREIGN PATENT DOCUMENTS
JP          9-232709          9/1997

*Primary Examiner* — Xiaoliang Chen
(74) *Attorney, Agent, or Firm* — Steptoe & Johnson LLP

(57) ABSTRACT

Provided is a layered electronic circuit device capable of realizing high-density/high-function mounting, easily inspecting and repairing the respective constituent elements, and improving the electronic connection characteristic. The layered electronic circuit device includes a first circuit substrate (101) and a second circuit substrate (102) which are arranged in parallel such that their substrate surfaces are opposed to each other. The peripheral portion of the first circuit substrate (101) and the peripheral portion of the second circuit substrate (102) are connected to each other by connection members (10a to 10d) having a wiring member (103) and a thermal hardening anisotropic conductive sheet (107), thereby performing electric connection.

7 Claims, 11 Drawing Sheets

U.S. PATENT DOCUMENTS

| | | | |
|---|---|---|---|
| 2002/0014518 A1* | 2/2002 | Totani et al. | 228/180.1 |
| 2002/0149074 A1* | 10/2002 | Imaeda | 257/432 |
| 2003/0002222 A1* | 1/2003 | Abe | 360/264.2 |
| 2003/0098339 A1* | 5/2003 | Totani et al. | 228/175 |
| 2003/0168254 A1* | 9/2003 | Kariya et al. | 174/261 |
| 2005/0006745 A1* | 1/2005 | Nishimura | 257/686 |
| 2005/0098879 A1* | 5/2005 | Kim | 257/712 |
| 2005/0151229 A1* | 7/2005 | Imaizumi et al. | 257/622 |
| 2005/0168961 A1* | 8/2005 | Ono et al. | 361/784 |
| 2005/0184381 A1* | 8/2005 | Asahi et al. | 257/693 |
| 2005/0211464 A1* | 9/2005 | Byun et al. | 174/259 |
| 2005/0237275 A1* | 10/2005 | Inoue et al. | 345/60 |
| 2006/0076671 A1* | 4/2006 | Kariya et al. | 257/702 |
| 2006/0237225 A1* | 10/2006 | Kariya et al. | 174/260 |
| 2006/0249823 A1* | 11/2006 | Kim | 257/676 |
| 2007/0038865 A1* | 2/2007 | Oggioni et al. | 713/178 |
| 2007/0069396 A1* | 3/2007 | Baek et al. | 257/782 |
| 2008/0029298 A1* | 2/2008 | Booth et al. | 174/350 |

* cited by examiner

LAYERED ELECTRONIC CIRCUIT DEVICE

This application is a national stage entry of International Application No. PCT/JP2007/065687, filed Aug. 10, 2007 designating the U.S., which claims the benefit of Japanese Application No. 2006-288159, filed Oct. 24, 2006.

TECHNICAL FIELD

The present invention relates to a layered electronic circuit device that is useful for mobile products (for example, cellular phone devices) requiring high-density/high-function mounting.

BACKGROUND ART

In recent years, there have been demands for high-value added, highly-functional, small and light mobile products typified by cellular phone devices with cameras, built-in TVs, or the like. Thus, there have been strong requests for the miniaturization and high-density mounting of components of the mobile products and the high functionality of circuit substrates. In these circumstances, in order to realize high-density mounting, attention has been shifted from two-dimensional mounting by which components are arranged in a plane to three-dimensional mounting by which components are three-dimensionally stacked. The three-dimensional mounting is performed with a 3D package (for example, a stack CSP) in which bare chips are stacked or a package stacked 3D device obtained by forming a semiconductor chip into a stand-alone temporary package and three-dimensionally stacking a plurality of the temporary packages. Moreover, techniques are available which arrange wiring substrates in multiple layers on each of which electronic components (a semiconductor chip, a passive component, and the like) are mounted, thereby realizing high-density/sophisticated mounting. For example, in a structure related to the above-described techniques and disclosed in Patent Document 1, wiring substrates are connected together via inner via holes in order to electrically connect the substrates together. The structure allows the substrates to be wired together with a minimum electric wiring length and is thus useful for applications requiring excellent high-frequency characteristics. However, the structure can only be inspected with the substrates stacked. Thus, even if a defect is found in the structure after completion, the built-in wiring and components disadvantageously prevent the defect from being analyzed or corrected.

Furthermore, some electronic components, for example, memories, involve a short supply cycle. Thus, if such electronic components are disposed of or packages thereof are changed, the circuits need to be drastically changed. This is disadvantageous in terms of time required for design and development. For example, in structures disclosed in Patent Documents 2 to 5, electrodes between which wiring and connections are made on the surface of or in the inner layer of a substrate are placed around the periphery of the substrate. Thus, substrates are electrically connected together by connecting, for example, a conductor such as a lead frame to the peripheral electrodes or connecting the electrodes together via connectors. However, with these methods, since the electrodes are located at the end face of each of the substrates, the number of electrodes connecting the substrates together is limited by the sizes or shapes of the substrates. Furthermore, the electric wiring needs to be long enough to reach the end face of the substrate. Thus, the structures are disadvantageously unsuitable for applications requiring excellent high-frequency characteristics. In contrast, with these methods, the substrates can be individually inspected, of which the substrates determined to be acceptable can be arranged in multiple layers advantageously. Furthermore, even if a defect occurs in the substrate, the electrodes at the substrate end face enable electrical analysis and correction of the defect and repair of the defective component. Moreover, even if any component is disposed of, only the substrate including the waste component needs to be modified. This also contributes to development efficiency.

Patent Document 1: Japanese Patent Laid-Open No. 11-220262
Patent Document 2: Japanese Patent Laid-Open No. 1-226192
Patent Document 3: Japanese Patent Laid-Open No. 4-262376
Patent Document 4: Japanese Patent Laid-Open No. 4-345083
Patent Document 5: Japanese Patent Laid-Open No. 2005-217348

DISCLOSURE OF THE INVENTION

However, in the method of establishing connections using the structure for connecting the end-face electrodes, for example, lead frames, connectors, or pins, as disclosed in Patent Documents 2 to 5, increasing the number of pins for the end-face electrode and reducing the pitch or the size of the apparatus are disadvantageously difficult. Moreover, when the electrodes are connected together via one conductor, if the substrate is deformed or warped, any of the electrodes may inappropriately contact the conductor.

Furthermore, in the structure using connectors for connections, the mounting area needs to be increased to provide a space for the connections of the connectors, the number of electrodes needs to be changed in association with an application used, and a mold is required which complies with the size and shape of the substrate. This is disadvantageous in terms of development costs, and the structure is thus not expected to exert significant effects. Additionally, in connection with the techniques disclosed in Patent Documents 2 to 4, none of the documents describe in consideration of the system as a whole. Members connecting the substrates together only provide the function of making simple electric continuity. The techniques thus leave room for improvement.

An object of the present invention is to provide a layered electronic circuit device which solves the conventional problems, realizes high-density/high-function mounting and facilitates inspection and repair of constituent elements, the layered electronic circuit device further improving the electric connection characteristic.

A layered electronic circuit device according to claim 1 of the present invention includes a first circuit substrate, a second circuit substrate located in parallel with the first circuit substrate such that the substrate surface of the second circuit substrate is opposed to the substrate surface of the first circuit substrate, and a connection member connected to the peripheral portion of the first circuit substrate and the peripheral portion of the second circuit substrate such that the first and second circuit substrates are electrically connected together only through the peripheral portions.

Claim 2 of the present invention sets forth the layered electronic circuit device according to claim 1 of the present invention, in which the connection member has a wiring member provided on the surface of a base material and extended along the arrangement direction of the first and second circuit substrates.

Claim 3 of the present invention sets forth the layered electronic circuit device according to claim 1 of the present invention, in which the connection member has a plurality of wiring members provided on the surface of a base material and extended along the arrangement direction of the first and second circuit substrates, the wiring members being formed at a predetermined pitch in a direction crossing the arrangement direction of the first and second circuit substrates, and a thermosetting insulating sheet or paste which contains conductive particles and is formed over the plurality of wiring members, wherein the peripheral portions of the first and second circuit substrates are connected together via the insulating sheet or paste.

A layered electronic circuit device according to Claim 4 of the present invention includes a first circuit substrate, a second circuit substrate located in parallel with the first circuit substrate such that the substrate surface of the second circuit substrate is opposed to the substrate surface of the first circuit substrate, a connection member connected to the peripheral portion of the first circuit substrate and the peripheral portion of the second circuit substrate such that the first and second circuit substrates are electrically connected together only through the peripheral portions, and a conductive protrusion interposed between the connection member and the peripheral portions of the first and second circuit substrates.

Claim 5 of the present invention sets forth the layered electronic circuit device according to claim 1 or 4 of the present invention, in which a component is mounted on the connection member.

Claim 6 of the present invention sets forth the layered electronic circuit device according to claim 1 of the present invention, in which the connection member has a wiring member provided on one surface of a base material and extended along the arrangement direction of the first and second circuit substrates and a shielding conductive member located on the other surface of the base material.

Claim 7 of the present invention sets forth the layered electronic circuit device according to claim 1 of the present invention, in which a spacer is located between the opposite substrate surfaces of the first and second circuit substrates.

Claim 8 of the present invention sets forth the layered electronic circuit device according to claim 1 or 4 of the present invention, in which an electric insulating material is interposed between the opposite substrate surfaces of the first and second circuit substrates.

The present invention realizes high-density/high-function mounting, facilitates inspection and repair of constituent elements, and improves the electric connection characteristic.

With the present configuration, even if the substrate is deformed or warped, any of the plurality of wiring patterns electrically connects the electrodes together. Thus, electric connection reliability can be improved.

Furthermore, different end-face electrode numbers of the substrate and applications with difference sizes can be flexibly handled by setting a base material for a plurality of wiring patterns, each of which is smaller than the electrode pitch, as a common standard base material and cutting the base material into pieces according to the number of end-face electrodes or the size.

Additionally, the mounting area of the substrate can be reduced by mounting a functional component such as a noise suppression component on the base material, thereby reducing the size of the device. Furthermore, the functions of the device can be improved by mounting another functional component on a space made as a result of reducing the mounting area.

Moreover, unwanted radiant noise can be effectively prevented by providing, for example, a shield electrode or a shield layer on the surface of the base material located opposite the wiring pattern.

BEST MODE FOR CARRYING OUT THE INVENTION

Embodiments of the present invention will be described below with reference to FIGS. 1 to 12.

Embodiment 1

FIGS. 1(*a*) and 1(*b*) to FIGS. 4(*a*) and 4(*b*) show Embodiment 1 of the present invention.

Figure 1A:
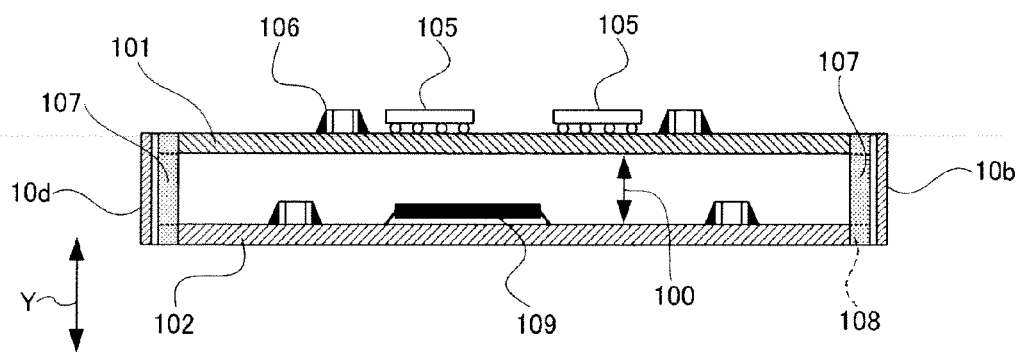
FIG. 1 is a sectional view and a plan view of a layered electronic circuit device according to Embodiment 1 of the present invention.
Figure 1B:
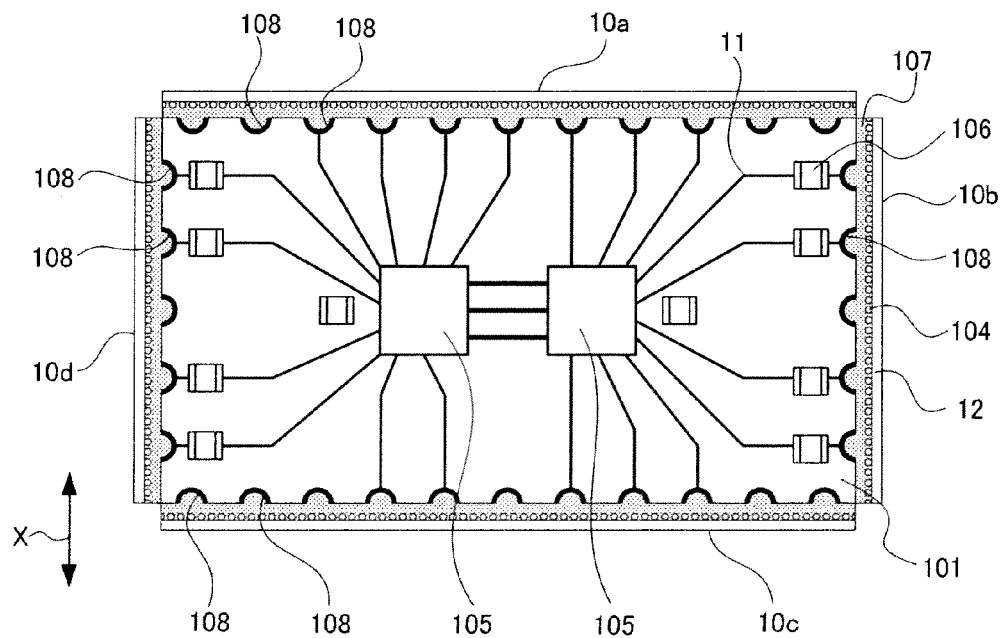
Figure 2:
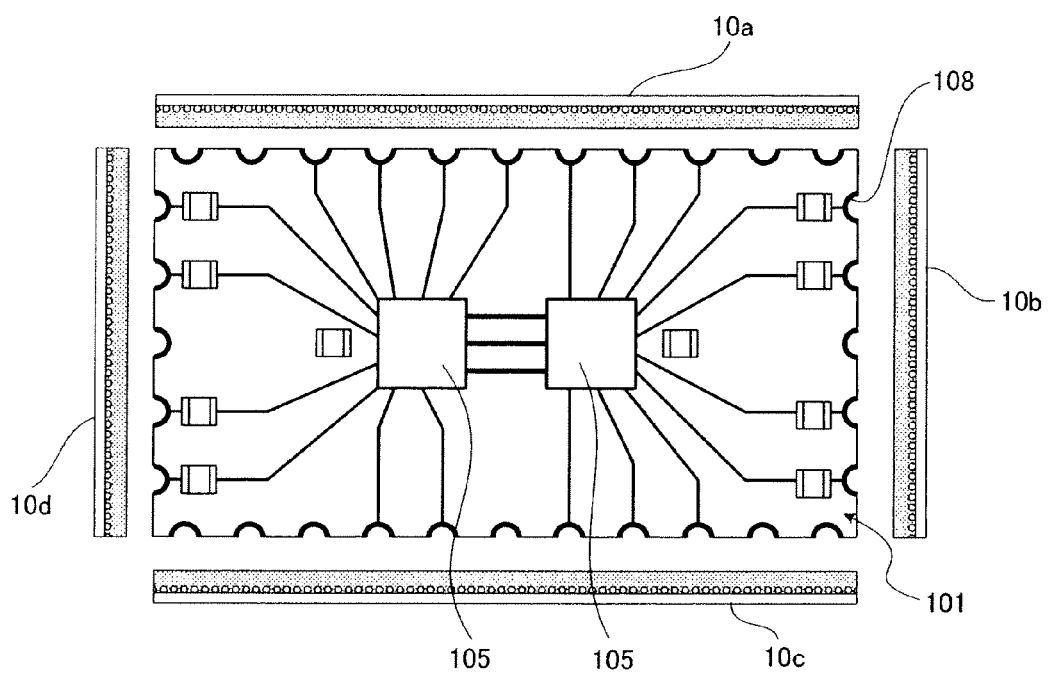
FIG. 2 is a plan view of an assembly process according to Embodiment 1.

FIGS. 1(*a*) and 1(*b*) show a layered electronic circuit device according to Embodiment 1. FIG. 2 to FIGS. 4(*a*) and 4(*b*) show an assembly process.

As shown in FIGS. 1(*a*) and 1(*b*), the layered electronic circuit device includes an upper first circuit substrate 101, a second circuit substrate 102 arranged in parallel with the first circuit substrate 101 with a gap 100 created between the first and second circuit substrates 101 and 102 in such a way that the substrate surfaces of the first and second circuit substrates 101 and 102 lie opposite each other, and plate-like connection members 10*a*, 10*b*, 10*c*, and 10*d* connecting only the peripheral end faces of the first circuit substrate 101 and the second circuit substrate 102 located below the first circuit substrate 101.

Each of the first and second circuit substrates 101 and 102 is a double-sided wiring substrate or a multilayer wiring substrate on which semiconductor chips 105, electronic components 106, and a bare chip 109 are mounted. Electrodes of the semiconductor chips 105, the electronic components 106, and the bare chip 109 are electrically connected to the respective corresponding electrodes by a connection member such as solder or a conductive adhesive. Here, the semiconductor chips 105 are semiconductor elements such as ICs or LSIs. The electronic components 106 are common passive components such as resistors, capacitors, inductors, barristers, or diodes. The bare chip 109 can also be mounted by flip chip mounting or wire bonding connection.

Common resin substrates or inorganic substrates can be used as the first and second circuit substrates 101 and 102. In particular, preferable substrates include glass epoxy substrates, substrates using an aramid base material, build-up substrates, glass ceramic substrates, and alumina substrates.

Figure 3A:
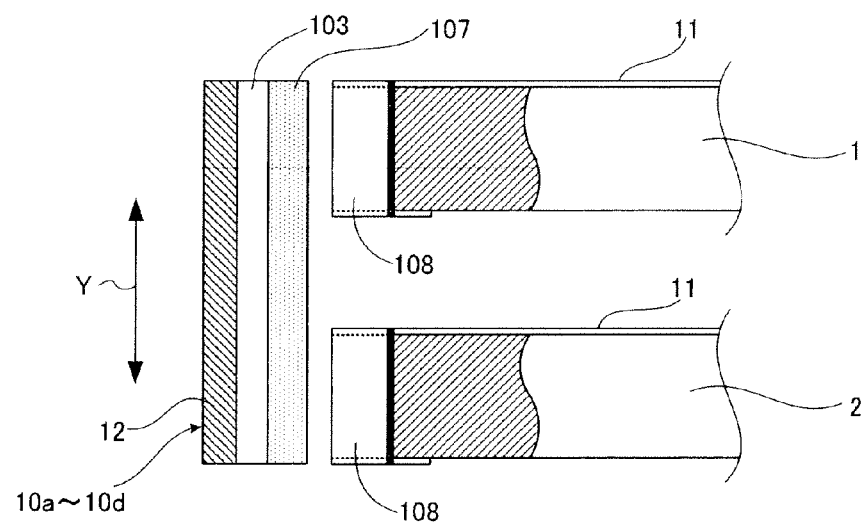
FIG. 3 is an enlarged sectional view and a plan view of an essential part of FIG. 2.
Figure 3B:
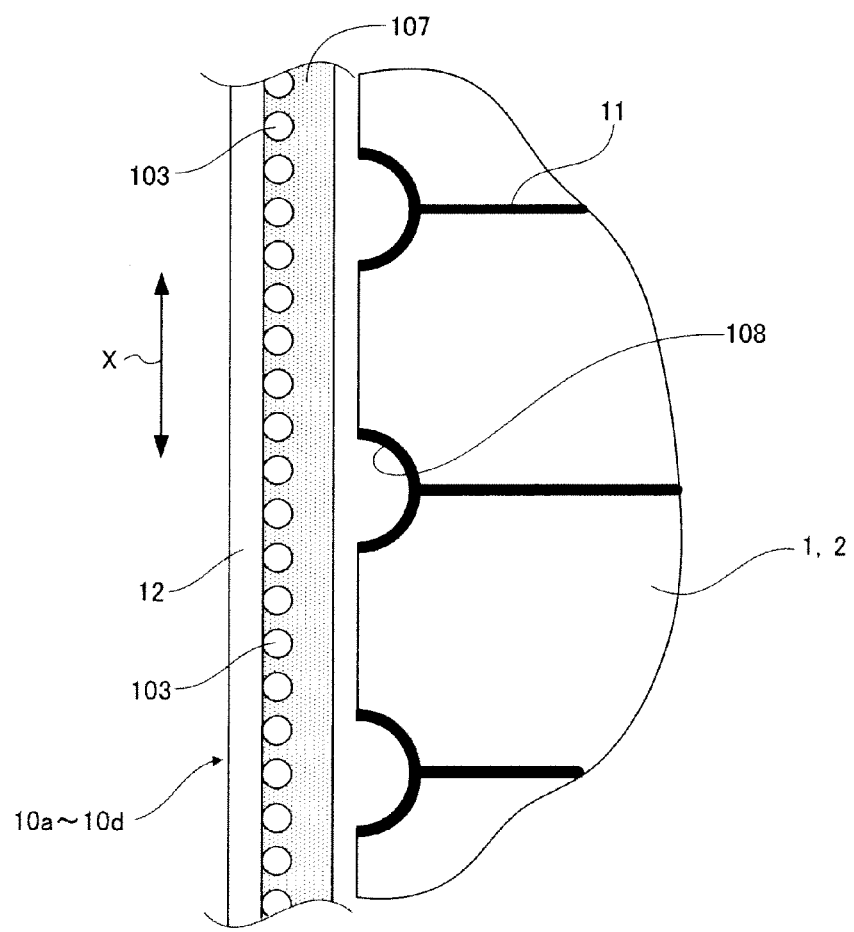

As shown in FIGS. 2, 3(a), and 3(b), a plurality of end-face electrodes 108 are provided at the peripheral end faces of the first and second circuit substrates 101 and 102. A wiring pattern 11 for power supply and electric signaling is connected to the end-face electrodes 108. The end-face electrodes 108 may be formed in the peripheral portions of the first and second circuit substrates 101 and 102 by using a mechanical cutting unit to partly cut, together with the substrate end faces, through-holes formed in a metal layer of copper or the like by electroless plating or via holes formed by electroless plating or filling of a conductive substance. Alternatively, the end-face electrodes 108 may be formed directly at the substrate ends by electroless plating, printing of a conductive substance, etching, or the like.

As shown in FIGS. 3(a) and 3(b), each of the connection members 10a, 10b, 10c, and 10d has a base material 12 that is a flexible resin film made of polyester, polyimide, aramid, or the like, a plurality of wiring members 103 extended on the surface of the base material 12 along the arrangement direction of the first and second circuit substrates (the direction of arrow Y) and formed at a predetermined pitch in a direction (the direction of arrow X) crossing the arrangement direction of the first and second circuit substrates, and a thermosetting anisotropic conductive sheet 107 formed over the plurality of wiring members 103. The thermosetting anisotropic conductive sheet 107 is located over the wiring member 103 in the form of an anisotropic conductive sheet or paste.

In FIGS. 3(a), 3(b), 4(a), and 4(b), the wiring member 103 of the connection member 103 is seen as a thin metal wire having a uniform thickness from one end to the other end thereof. However, specifically, the wiring members 103 are arranged at a pitch equal to or smaller than that of the end-face electrodes 108. In this case, in a single- or double-sided wiring substrate or a multilayer wiring substrate, the end-face electrodes of pitch 200 microns and the wiring members 103 of pitch 50 microns are patterned on the flexible resin film of thickness about 125 μm.

Specifically, in the anisotropic conductive sheet 107, conductive particles are dispersed in a film-like epoxy resin. The anisotropic conductive sheet 107 is characterized in that gaps in predetermined electrically conductive portions of the anisotropic conductive sheet 107 in which the conductive particles are sandwichingly held are each equal to or smaller than the particle sizes of the conductive particles, and thus establish an electrically conductive state, whereas gaps in the other portions are insulated.

Figure 4A:
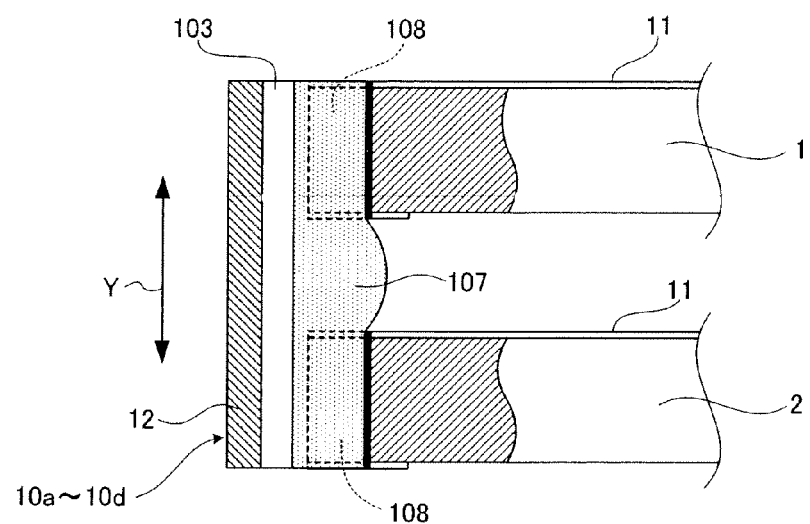
FIG. 4 is an enlarged sectional view and a plan view of an essential part of the completely assembled layered electronic circuit device.
Figure 4B:
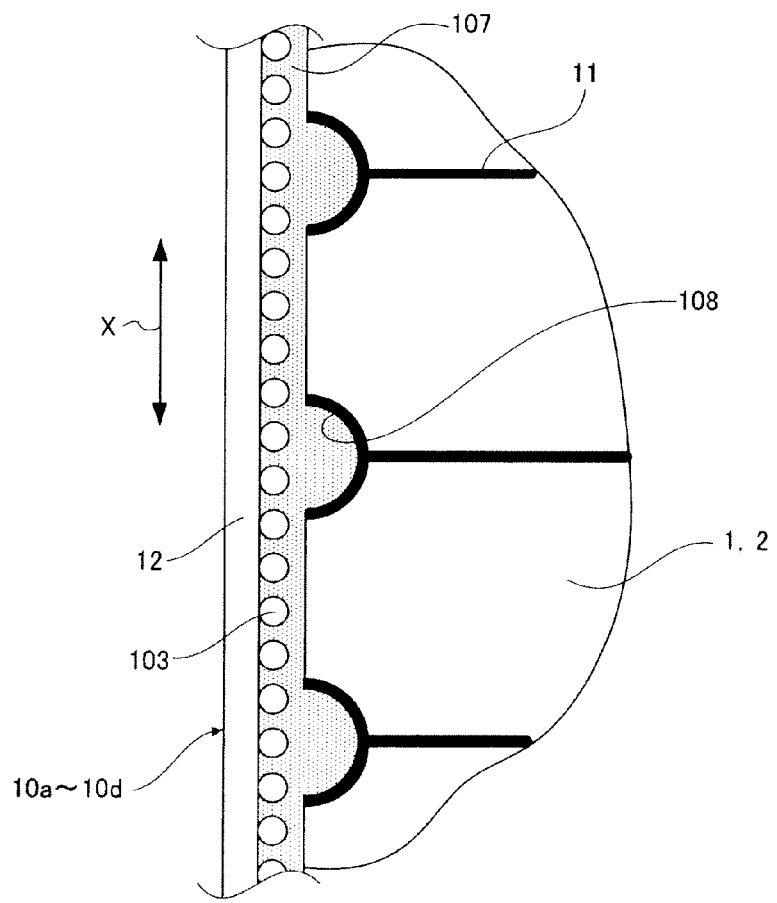

Thus, a pressure bonding tool is used to heat and pressurize the connection members 10a, 10b, 10c, and 10d against the end faces of the first and second circuit substrates 101 and 102 arranged in parallel in such a way that the substrate surfaces of the first and second circuit substrates 101 and 102 lie opposite each other, with the anisotropic conductive sheet 107 stuck to the wiring member 103 as a coat or tape so as to be located inside the connection members 10a, 10b, 10c, and 10d. Then, the first and second circuit substrates 101 and 102 are connected together as shown in FIGS. 4(a) and 4(b). In this condition, the end-face electrodes 108 of the first circuit substrate 101 are simultaneously electrically connected to the end-face electrodes 108 of the second circuit substrate 102 via the anisotropic conductive sheet 107 and the wiring member 103.

Embodiment 2

FIGS. 5(a) and 5(b) to FIG. 7 show Embodiment 2 of the present invention.

In the description below, components exerting effects similar to those in FIGS. 1(a) and 1(b) to FIGS. 4(a) and 4(b) showing Embodiment 1 are denoted by the same reference numerals.

In Embodiment 1 described above, the connections and electric connections are achieved by allowing the anisotropic conductive sheet 107 of the connection members 10a to 10d to abut against the end-face electrodes 108 of the first and second circuit substrates 101 and 102 to be hardened. The present embodiment is the same as Embodiment 1 except that a conductive protrusion 13 is provided on each of end-face electrodes 108 as shown in FIG. 5.

Figures 5A, 5B:
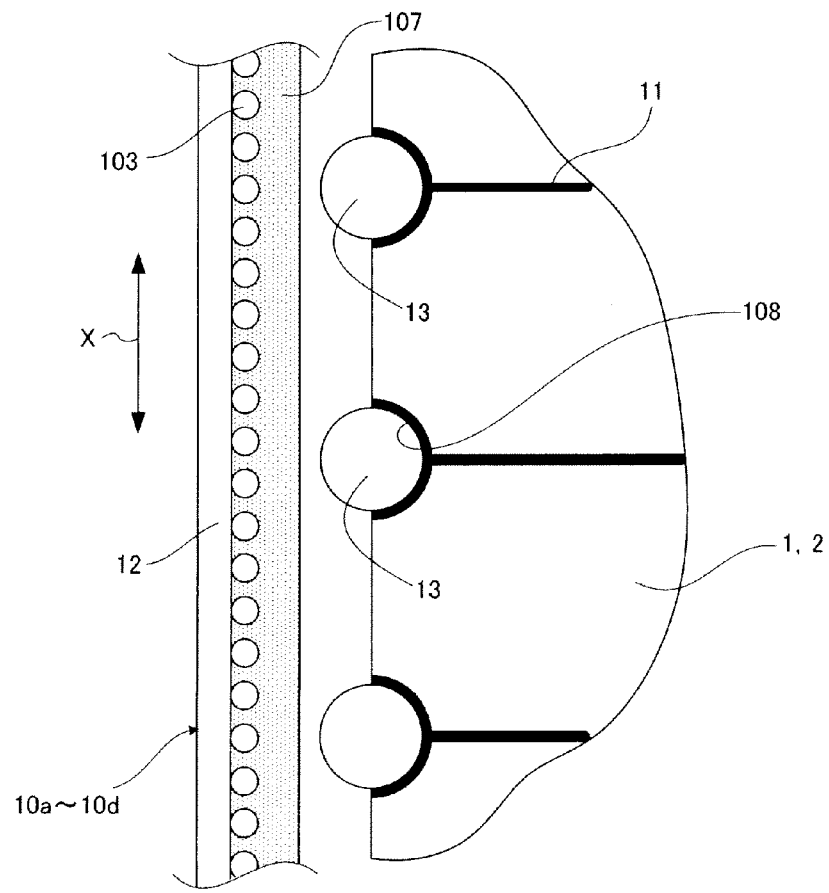
FIG. 5 is an enlarged sectional view and a plan view of an essential part of an assembly process for a layered electronic circuit device according to Embodiment 2 of the present invention.

FIGS. 5(a) and 5(b) show that connection members 10a to 10d have not yet been pressed against first and second circuit substrates 101 and 102 and that the conductive protrusion 13 is provided on each of the end-face electrodes 108 of the first and second circuit substrates 101 and 102. The conductive protrusion 13 can be formed of a solder ball.

Figure 6A:
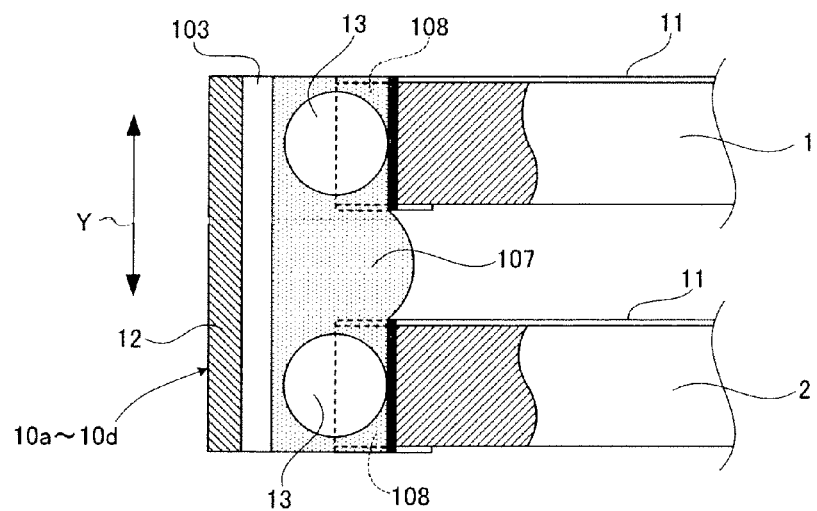
FIG. 6 is an enlarged sectional view and a plan view of an essential part of the completely assembled layered electronic circuit device according to Embodiment 2.
Figure 6B:
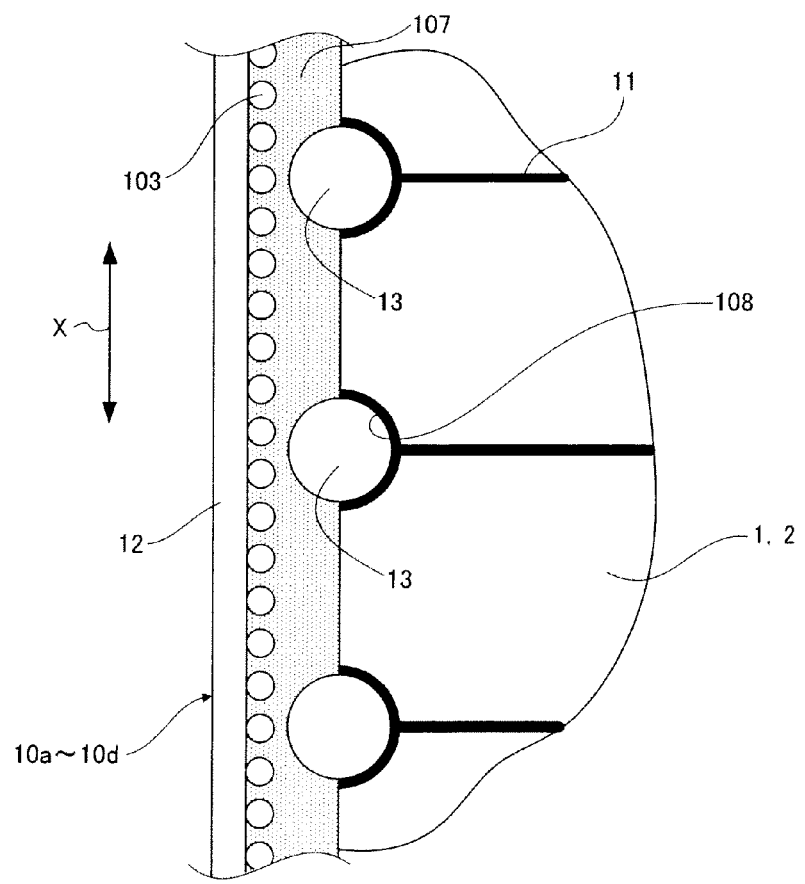

A pressure bonding tool is used to heat and pressurize the connection members 10a, 10b, 10c, and 10d against the end faces of the first and second circuit substrates 101 and 102 arranged in parallel in such a way that the substrate surfaces of the first and second circuit substrates 101 and 102 lie opposite each other, with an anisotropic conductive sheet 107 stuck to a wiring member 103 as a coat or tape so as to be located inside the connection members 10a, 10b, 10c, and 10d. Then, the first and second circuit substrates 101 and 102 are connected together as shown in FIGS. 6(a) and 6(b). In this condition, the end-face electrodes 108 of the first circuit substrate 101 are simultaneously electrically connected to the end-face electrodes 108 of the second circuit substrate 102 via the conductive protrusions 13, the anisotropic conductive sheet 107, and the wiring member 103. This improves the reliability of the electric connections.

Figure 7:
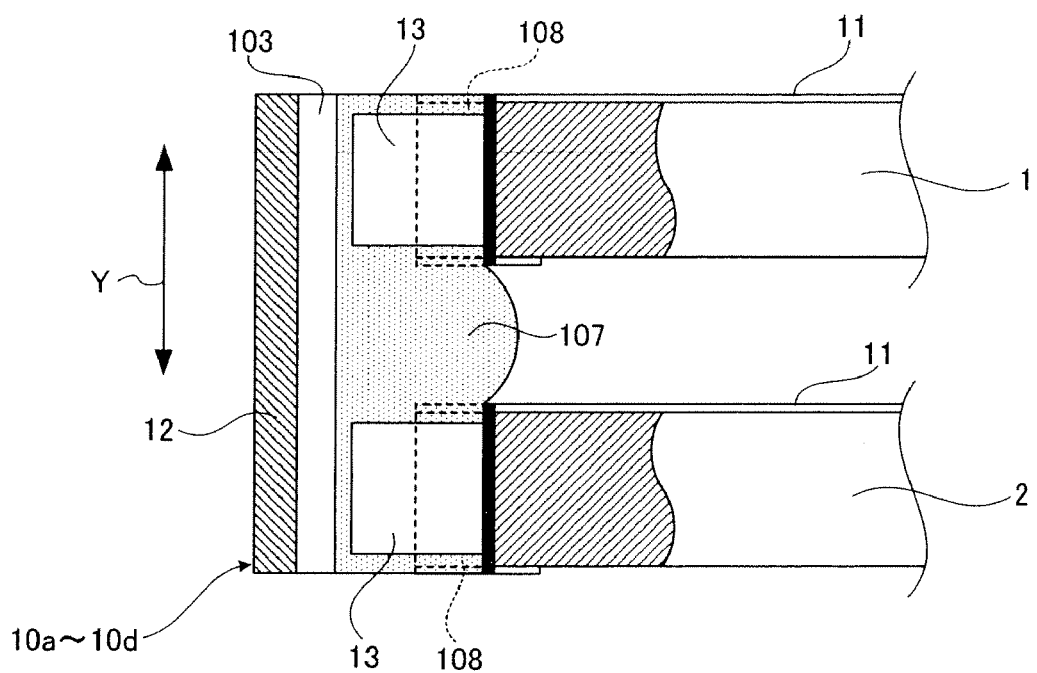
FIG. 7 is an enlarged sectional view of an essential part of the completely assembled layered electronic circuit device according to Embodiment 2 in another example.

In the above description, the conductive protrusion 13 is a solder ball. However, the conductive protrusion 13 may be formed of solder or a bump or by plating. FIG. 7 shows the conductive protrusion 13 formed by cutting a cylindrical linear material. This conductive protrusion 13 has a diameter of 50 microns.

Embodiment 3

Figure 8A:
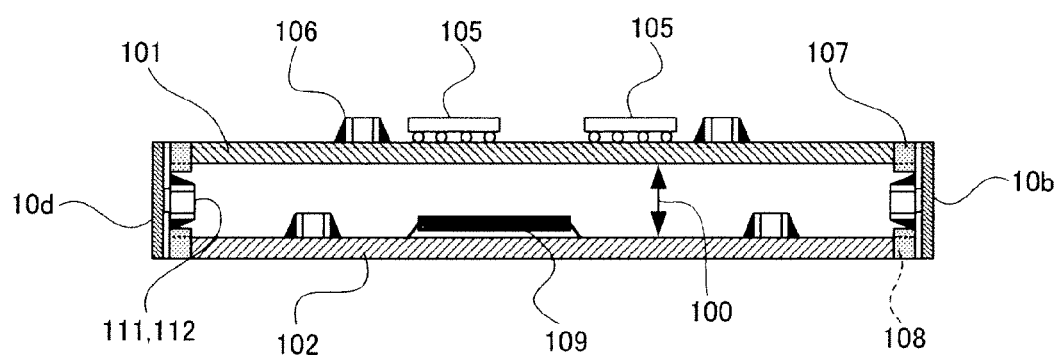
FIG. 8 is a sectional view of a layered electronic circuit device according to Embodiment 3 of the present invention and a plan view of a connection member used for the layered electronic circuit device.
Figure 8B:
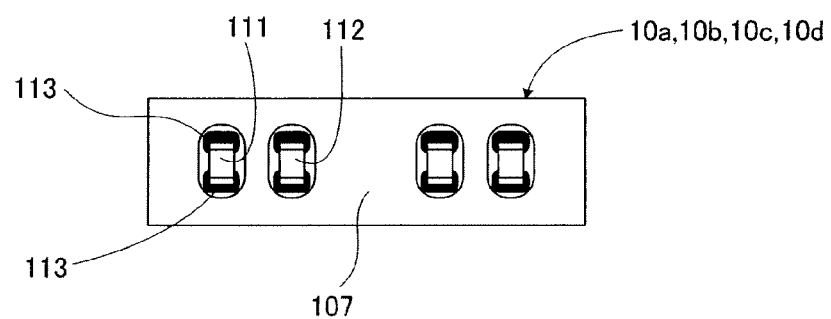
Figure 9:
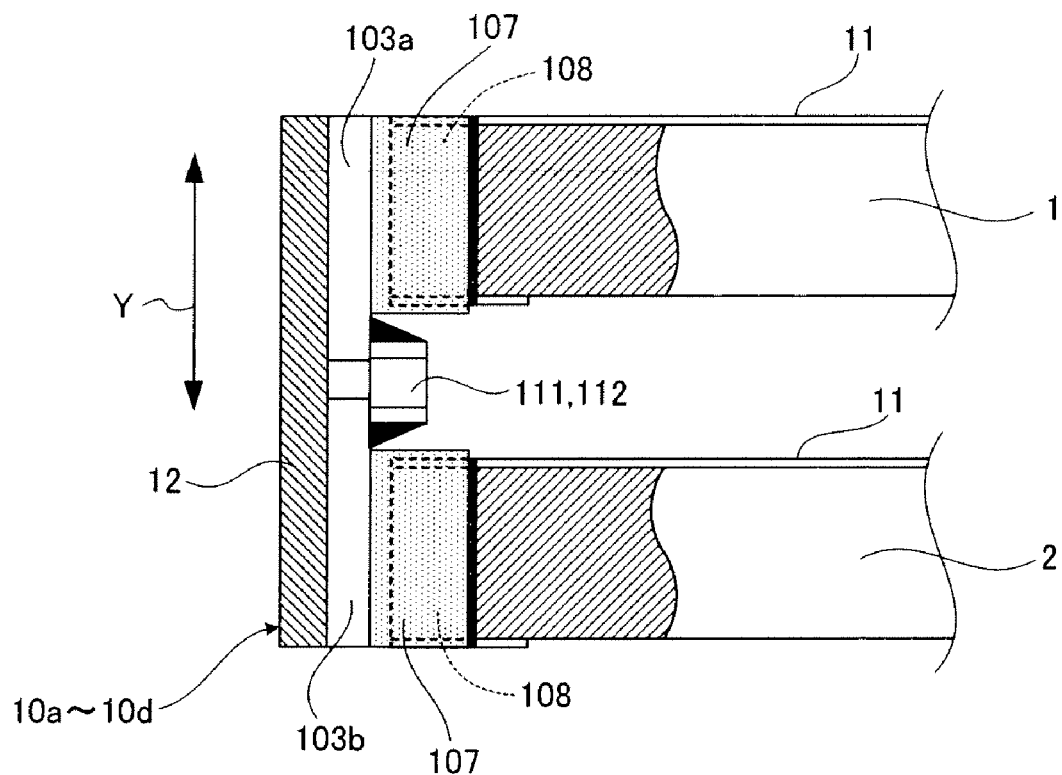
FIG. 9 is an enlarged sectional view of an essential part of the completely assembled layered electronic circuit device according to Embodiment 3.

FIGS. 8(a), 8(b), and 9 show Embodiment 3 of the present invention.

In the description below, components exerting effects similar to those in FIGS. 1(a) and 1(b) to FIGS. 4(a) and 4(b) showing Embodiment 1 are denoted by the same reference numerals.

In Embodiment 3, electronic components 111 and 112 are mounted in each of connection members 10a to 10d. An anisotropic conductive sheet 107 is formed as shown in FIG. 8(*b*) except for the mounting positions of the electronic components 111 and 112. A wiring member 103 is divided into a wiring member 103a and a wiring member 103b only at the mounting positions of the electronic components 111 and 112 and the electronic components 111 and 112 are mounted between the wiring members 103a and 103b. Except for the above-described arrangement, Embodiment 3 is the same as Embodiment 1.

Specifically, if the wiring members 103a and 103b are composed of wiring patterns, the electronic components 111 and 112 are mounted by forming land patterns 113 provided in the wiring patterns. In this case, any electronic component can be mounted, provided that the component is smaller in size than the side surface of the device. Thus, the electronic components mounted on the first and second circuit substrates 101 and 102 in Embodiment 1 can be mounted on the connection members 10a to 10d. Consequently, the layered electronic circuit device can be miniaturized and provided with sophisticated functions. More specifically, when first and second circuit substrates 101 and 102 are connected together, capacitors are mounted, as the electronic components 111 and 112, on the wiring members out of the wiring members 103 formed in the connection members 10a to 10d, from which possible noise needs to be eliminated, or resistors are mounted, as the electronic components 111 and 112, on the wiring members out of the wiring members 103 formed in the connection members 10a to 10d, for which a resistance value needs to be adjusted. Furthermore, a pressure bonding tool is used to heat and pressurize the connection members 10a, 10b, 10c, and 10d with the electronic components 111 and 112 mounted thereon, against the end faces of the first and second circuit substrates 101 and 102 arranged in parallel in such a way that the substrate surfaces of the first and second circuit substrates 101 and 102 lie opposite each other, with the anisotropic conductive sheet 107 stuck to the wiring member 103 as a coat or tape so as to be located inside the connection members 10a, 10b, 10c, and 10d. Then, the first and second circuit substrates 101 and 102 are connected together, and the electric connections are completed via the capacitor connections or regulated resistors.

Embodiment 4

Figure 10A:
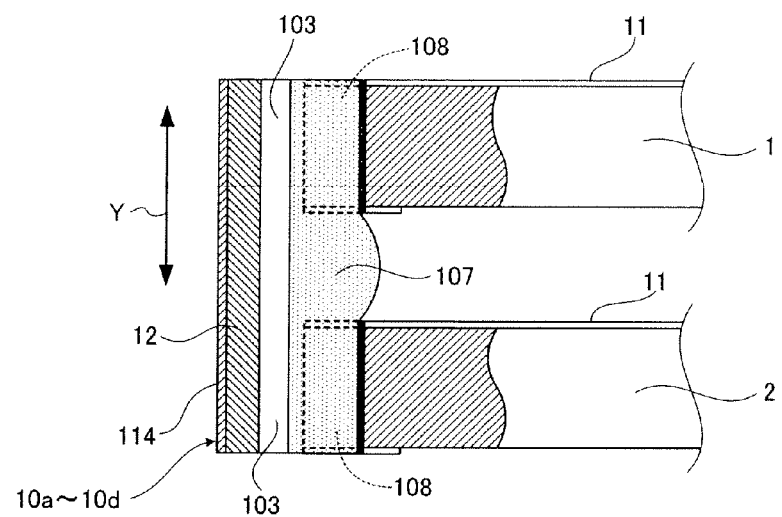
FIG. 10 is an enlarged sectional view and a plan view of an essential part of a layered electronic circuit device according to Embodiment 4 of the present invention.
Figure 10B:
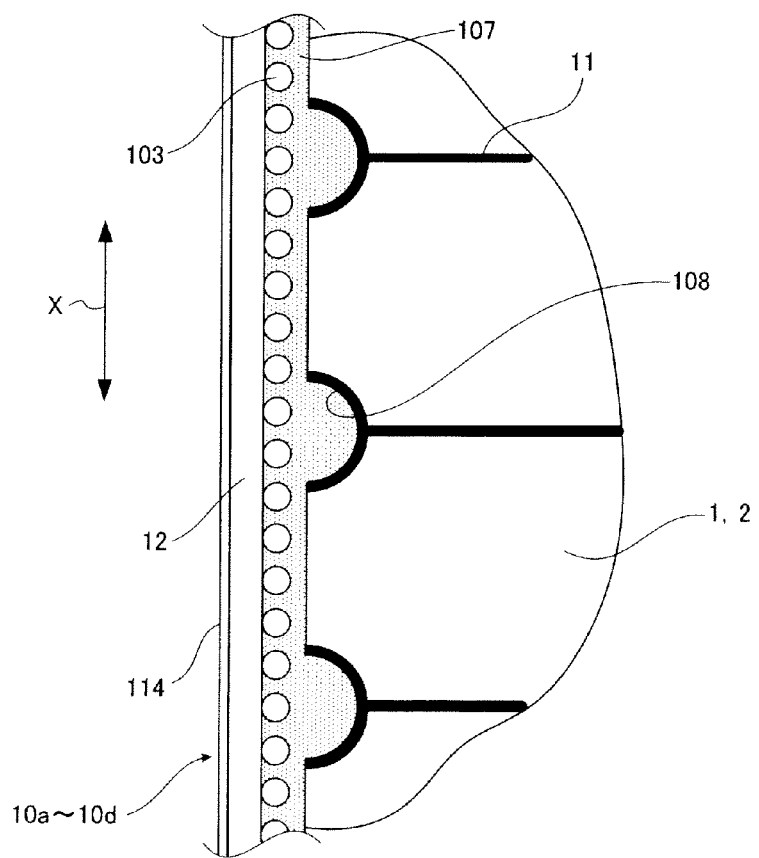

FIGS. 10(*a*) and 10(*b*) show Embodiment 4 of the present invention.

In the description below, components exerting effects similar to those in FIGS. 1(*a*) and 1(*b*) to FIGS. 4(*a*) and 4(*b*) showing Embodiment 1 are denoted by the same reference numerals.

Embodiment 4 is the same as Embodiment 1 except that a shielding conductive material 114 is located on one surface of a base material 12 of each of connection members 10a to 10d, which surface lies opposite the other surface of the base material 12 on which a wiring member 103 is provided.

With this configuration, the conductive material 114 exerts an electromagnetic shielding effect. The conductive material 114 may be provided all over the side surfaces of the connection members 10a to 10d, or on a part of each of the side surfaces so as to connect the side surfaces together.

Specifically, the conductive material 114 is made of an aluminum deposition film and is connected to the ground pattern of a wiring pattern 11.

This configuration can reduce unwanted radiation from the electronic components or a bare chip 109 on a second circuit substrate 102 and prevent malfunction of the circuit caused by exogenous noise.

Embodiment 5

Figure 11:
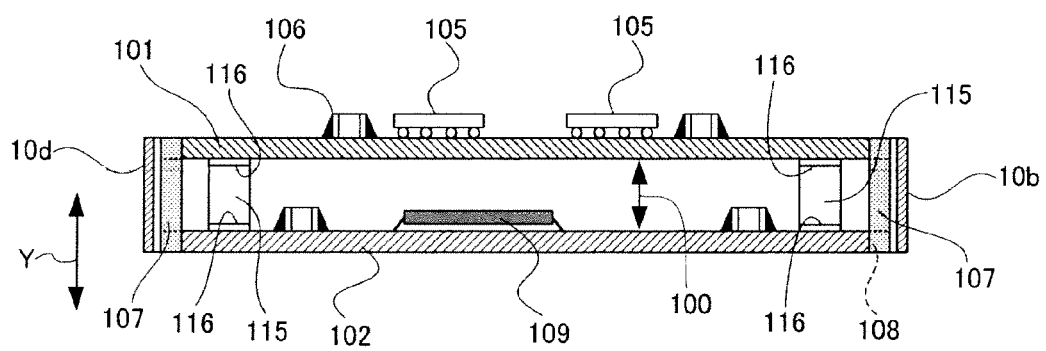
FIG. 11 is a sectional view of a layered electronic circuit device according to Embodiment 5 of the present invention.

FIG. 11 shows Embodiment 5 of the present invention.

In the description below, components exerting effects similar to those in FIGS. 1(*a*) and 1(*b*) to FIGS. 4(*a*) and 4(*b*) showing Embodiment 1 are denoted by the same reference numerals.

Embodiment 5 is the same as Embodiment 1 except that spacers 115 are arranged between the opposite substrate surfaces of first and second circuit substrates 101 and 102.

The spacers 115 are composed of an insulating resin or conductive metal. In particular, by providing pads 116 for the spacers 115 on each of the first and second circuit substrates 101 and 102 and connecting the spacers 115 to the respective pads 116 using a conductive adhesive or paste, the mechanical strength of the device can be improved and the spacers can be used as wiring for power supply or signaling. The spacers 115 are, for example, cylindrical and are mounted on the circuit substrate 102 together with appropriate components. Thereafter, the spacers 115 are joined to the first circuit substrate 101 with appropriate components mounted thereon. Finally, the first and second circuit substrates 101 and 102 are joined to connection members 10a to 10d to complete a layered electronic circuit device.

Embodiment 6

Figure 12:
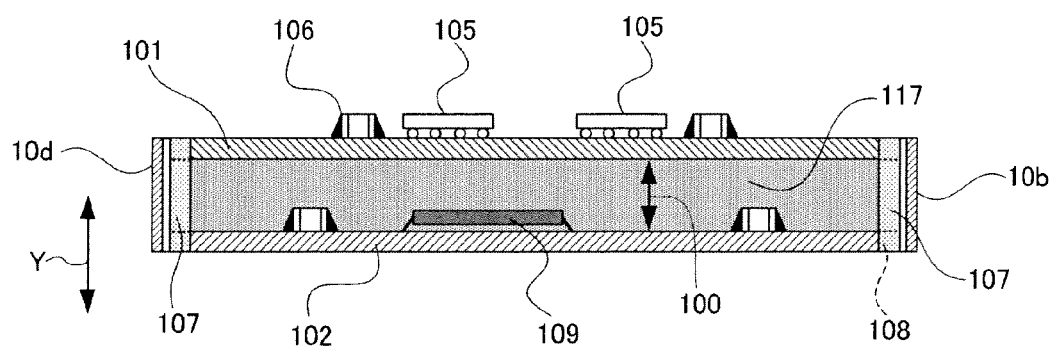
FIG. 12 is a sectional view of a layered electronic circuit device according to Embodiment 6 of the present invention.

FIG. 12 shows Embodiment 6 of the present invention.

In the description below, components exerting effects similar to those in FIGS. 1(*a*) and 1(*b*) to FIGS. 4(*a*) and 4(*b*) showing Embodiment 1 are denoted by the same reference numerals.

In Embodiment 6, a space portion between first and second circuit substrates 101 and 102 is filled with an electric insulating material 117. The electric insulating material 117 is composed of a compound containing an inorganic filler and a thermosetting resin so as to offer an improved mechanical strength.

Examples of a suitable resin for the electric insulating material 117 include a phenol resin, a urea resin, a melamine resin, an epoxy resin, an unsaturated polyester resin, a diallyl phthalate resin, a polyimide resin, a silicone resin, and a polyurethane resin.

A specific assembly process involves placing the first circuit substrate 101 with the appropriate components mounted thereon over the second circuit substrate 102 with the appropriate components mounted thereon in such a way that the electric insulating material 117 is sandwiched between the first and second circuit substrates 101 and 102 and heated so as to be flexible. Thereafter, a pressure bonding tool is used to heat and pressurize connection members 10a, 10b, 10c, and 10d against the end faces of the first and second circuit substrates 101 and 102, with an anisotropic conductive sheet 107 stuck to a wiring member 103 as a coat or tape so as to be located inside the connection members 10a, 10b, 10c, and 10d. Then, the first and second circuit substrates 101 and 102 are connected together to complete a layered electronic circuit device.

The electric insulating material 117 need not cover the entire space between the first and second circuit substrates 101 and 102. If a heating component such as a semiconductor chip is mounted on the circuit substrate, heat from the heating component can be prevented from being trapped in the space, without providing the electric insulating material 117 in the area in which the heating component is provided.

Embodiment 2 can be similarly implemented by using any one of Embodiments 3 to 6 or a combination of at least two of Embodiments 3 to 6.

Embodiment 3 can be similarly implemented by using any one of Embodiments 2 and 4 to 6 or a combination of at least two of Embodiments 2 and 4 to 6.

Embodiment 4 can be similarly implemented by using any one of Embodiments 2, 3, 5, and 6 or a combination of at least two of Embodiments 2, 3, 5, and 6.

Embodiment 5 can be similarly implemented by using any one of Embodiments 2 to 4 and 6 or a combination of at least two of Embodiments 2 to 4 and 6.

Embodiment 6 can be similarly implemented by using any one of Embodiments 2 to 5 or a combination of at least two of Embodiments 2 to 5.

In the above-described embodiments, the connection member connecting the peripheral portions of the first and second circuit substrates 101, 102 together is composed of the anisotropic conductive sheet 107. However, the connection member may be composed of a thermosetting anisotropic conductive paste. Alternatively, the connection member may be composed of a thermosetting sheet or paste offering conductivity that is not anisotropic. The connection member may have a plurality of wiring members extended on the surface of the base material along the arrangement direction of the first and second circuit substrates and formed at a predetermined pitch in a direction crossing the arrangement direction of the first and second circuit substrates, and a thermosetting insulating sheet or paste containing conductive particles which is formed over the plurality of wiring members.

INDUSTRIAL APPLICABILITY

The layered electronic circuit device according to the present invention realizes high-density/high-function mounting, facilitates inspection and repair of the constituent elements, and allows the electric connection characteristic to be improved. The layered electronic circuit device according to the present invention is thus applicable to various types of mobile equipment, for which sophisticated and multiple functions and size reduction are required.

The invention claimed is:

1. A layered electronic circuit device comprising:
a first circuit substrate having first end-face electrodes at the peripheral end faces of said first circuit substrate having a first pitch;
a second circuit substrate having second end-face electrodes at the peripheral end faces of said second circuit substrate having a second pitch, and being opposed to the first circuit substrate; and
a connection member electrically connecting the first end-face electrodes and the second end-face electrodes via a thermosetting insulating sheet or paste containing conductive particles;
wherein the connection member comprises a plurality of wiring members on a surface of a base material and extending along a direction perpendicular to the first and second circuit substrates, the wiring members having a shorter pitch in a peripheral direction of the first and second circuit substrates than the first and second pitches, and the first and second end-face electrodes and the wiring members are electrically connected.

2. The layered electronic circuit device according to claim 1, wherein
a conductive protrusion is between the connection member and the peripheral portions of the first and second circuit substrates.

3. The layered electronic circuit device according to claim 1, wherein a component is mounted on the connection member.

4. The layered electronic circuit device according to claim 1, wherein the connection member has a wiring member on one surface of a base material and extending along an arrangement direction of the first and second circuit substrates; and
a shielding conductive member on another surface of the base material.

5. The layered electronic circuit device according to claim 1, wherein a spacer is between the opposite substrate surfaces of the first and second circuit substrates.

6. The layered electronic circuit device according to claim 1, wherein an electric insulating material containing an inorganic filler and a thermosetting resin is between the opposite substrate surfaces of the first and second circuit substrates.

7. The layered electronic circuit device according to claim 1, wherein the insulating sheet is a thermosetting anisotropic conductive sheet or the insulating paste is a thermosetting anisotropic conductive paste.

* * * * *